US008898046B2

(12) United States Patent
Moos et al.

(10) Patent No.: US 8,898,046 B2
(45) Date of Patent: Nov. 25, 2014

(54) METHOD TO IMPROVE RESERVOIR SIMULATION AND RECOVERY FROM FRACTURED RESERVOIRS

(75) Inventors: Daniel Moos, Palo Alto, CA (US); Colleen Barton, Portola Valley, CA (US)

(73) Assignee: Baker Hughes Incorporated, Houston, TX (US)

( * ) Notice: Subject to any disclaimer, the term of this patent is extended or adjusted under 35 U.S.C. 154(b) by 368 days.

(21) Appl. No.: 13/315,880

(22) Filed: Dec. 9, 2011

(65) Prior Publication Data

US 2012/0310613 A1 Dec. 6, 2012

Related U.S. Application Data

(60) Provisional application No. 61/421,785, filed on Dec. 10, 2010.

(51) Int. Cl.
G06G 7/48 (2006.01)
E21B 43/26 (2006.01)
G01V 11/00 (2006.01)

(52) U.S. Cl.
CPC ............... *E21B 43/26* (2013.01); *G01V 11/00* (2013.01)
USPC ...... 703/10; 703/6; 703/9; 166/53; 166/250.1

(58) Field of Classification Search
CPC ............. G06G 7/57; G06G 7/48; G06G 7/50; E21B 43/25; E21B 43/26; E21B 43/003; E21B 4/00; G06F 17/50
USPC ............................ 703/10, 6, 9; 166/53, 250.1
See application file for complete search history.

(56) References Cited

U.S. PATENT DOCUMENTS 6,615,917 B2  9/2003  Bussear et al.
6,658,567 B1  12/2003  Barton et al.
6,941,464 B1  9/2005  Barton et al.
7,313,481 B2  12/2007  Moos et al.
7,349,807 B2  3/2008  Moos et al.

(Continued)

OTHER PUBLICATIONS

McClure, Mark et al., "Numerical and Analytical Modeling of the Mechanisms of Induced Seismicity During Fluid Injection", Oct. 24-27, 2010, Geothermal Resources Council 2010 Annual Meeting, GRC Transactions, vol. 34.*
Hossain, M.M., M.K. Rahman, and S.S. Rahman, 2002. A Shear Dilation Stimulation Model for Production Enhancement From Naturally Fractured Reservoirs, Jun. 2002 SPE Journal, 183-195.
McClure, M. and R.N. Horne, 2010 Numerical and Analytical Modeling of the Mechanisms of Induced Seismicity During Fluid Injection GRC Transactions, vol. 34, 381-396.

(Continued)

*Primary Examiner* — Kamini S Shah
*Assistant Examiner* — Cedric D Johnson
(74) *Attorney, Agent, or Firm* — Cantor Colburn LLP

(57) ABSTRACT

A method for modeling flow properties over a series of time increments of a reservoir in an earth formation having a plurality of fractures is disclosed. The method includes: building a three-dimensional stress field representing stresses in the reservoir; building a three-dimensional discrete fracture network (NFM) having fracture flow properties using information obtained from a tool or changes to the stress field; running a flow simulation of the reservoir for a time increment using the NFM to model the flow properties of the reservoir for that time increment; computing a latest change in the three-dimensional stress field from the flow simulation; and incrementing the time increment and iterating the building the NFM using the latest change in the stress field, the running of the flow simulation using the latest NFM, and the computing a latest change in the stress field from the latest running of the flow simulation.

17 Claims, 4 Drawing Sheets

(56) References Cited

U.S. PATENT DOCUMENTS

| | | |
|---|---|---|
| 7,529,624 B2 | 5/2009 | Castillo et al. |
| 7,675,817 B2 | 3/2010 | Moos |
| 7,698,065 B2 | 4/2010 | Moos et al. |
| 2004/0199329 A1 | 10/2004 | Stone |
| 2008/0133186 A1 | 6/2008 | Li et al. |
| 2009/0065252 A1 | 3/2009 | Moos et al. |
| 2009/0119082 A1 | 5/2009 | Fitzpatrick et al. |
| 2010/0076738 A1* | 3/2010 | Dean et al. .......... 703/7 |
| 2011/0257944 A1* | 10/2011 | Du et al. ............ 703/2 |

OTHER PUBLICATIONS

Shapiro, S.A., C. Dinske, and E. Rothert, 2006. Hydraulic-fracturing controlled dynamics of microseismic clouds, Geophys. Res. Lett., 33, L14312, doi:10.1029/2006GL026365.

Tezuka, K., T. Tamagawa and K. Watanabe, 2005. Numerical simulation of hydraulic shearing in fractured reservoir, Proc. World Geothermal Congress, Antalya, Turkey, Apr. 24-29, 2005.

Notification of Transmittal of the International Search Report and the Written Opinion of the International Searching Authority, or the Declaration; PCT/US2011/064214; Nov. 7, 2012.

\* cited by examiner

METHOD TO IMPROVE RESERVOIR SIMULATION AND RECOVERY FROM FRACTURED RESERVOIRS

CROSS REFERENCE TO RELATED APPLICATIONS

This application claims the benefit of an earlier filing date from U.S. Provisional Application Ser. No. 61/421,785 filed Dec. 10, 2010, the entire disclosure of which is incorporated herein by reference.

BACKGROUND

1. Field of the Invention

The invention disclosed herein relates to evaluating reservoirs in earth formations, and, in particular, to modeling flow properties of the reservoirs.

2. Description of the Related Art

Hydrocarbons are typically recovered by having the hydrocarbons flow out of reservoirs in formation rock and into a well that penetrates the formation rock. The hydrocarbons are then extracted from the well at the surface of the earth.

In order to efficiently use production resources, a commercial reservoir simulator may be used to model flow in fractured media. Commercial reservoir simulators convert permeable fracture networks into equivalent porous media for simulation of the fractured media. Unfortunately, these commercial reservoir simulators lose accuracy due to their use of approximations. It would be well received in the hydrocarbon recovery industry if models of the hydrocarbon containing reservoirs could be improved to increase their accuracy.

BRIEF SUMMARY

Disclosed is a method for modeling flow properties over a series of time increments of a reservoir in an earth formation having a plurality of fractures. The method includes: obtaining information about the plurality of fractures using a data acquisition tool; building a three-dimensional stress field representing stresses in the reservoir; building a three-dimensional natural fracture model (NFM) having fracture flow properties of the plurality of fractures using the obtained information or changes to the three-dimensional stress field; running a flow simulation of the reservoir for a time increment using the NFM to model the flow properties of the reservoir for that time increment; computing a latest change in the three-dimensional stress field from the flow simulation; and incrementing the time increment and iterating the building the NFM using the latest change in the three-dimensional stress field, the running of the flow simulation using the latest NFM to model the flow properties, and the computing a latest change in the three-dimensional stress field from the latest running of the flow simulation, wherein the incrementing continues for the series of time increments.

Also disclosed is an apparatus for modeling flow properties over a series of time increments of a reservoir in an earth formation having a plurality of fractures. The apparatus includes: a data acquisition tool configured to obtain information about the plurality of fractures; and a processor configured to implement a method. The method includes: building a three-dimensional stress field representing stresses in the reservoir; building a three-dimensional natural fracture model (NFM) having fracture flow properties of the plurality of fractures using information obtained from the tool or changes to the three-dimensional stress field; running a flow simulation of the reservoir for a time increment using the NFM to model the flow properties of the reservoir for that time increment; computing a latest change in the three-dimensional stress field from the flow simulation; and incrementing the time increment and iterating the building the NFM using the latest change in the three-dimensional stress field, the running of the flow simulation using the latest NFM to model the flow properties, and the computing a latest change in the three-dimensional stress field from the latest running of the flow simulation, wherein the incrementing continues for the series of time increments.

Further disclosed is a non-transitory computer readable medium having computer executable instructions for modeling flow properties over a series of time increments of a reservoir in an earth formation having a plurality of fractures by implementing a method. The method includes: obtaining information about the plurality of fractures using a data acquisition tool; building a three-dimensional stress field representing stresses in the reservoir; building a three-dimensional natural fracture model (NFM) having fracture flow properties of the plurality of fractures using the obtained information or a change to the three-dimensional stress field; running a flow simulation of the reservoir for a time increment using the NFM to model the flow properties of the reservoir for that time increment; computing a latest change in the three-dimensional stress field from the flow simulation; and incrementing the time increment and iterating the building the NFM using the latest change in the three-dimensional stress field, the running of the flow simulation using the latest NFM to model the flow properties, and the computing a latest change in the three-dimensional stress field from the latest running of the flow simulation, wherein the incrementing continues for the series of time increments.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method is presented herein by way of exemplification and not limitation with reference to the Figures.

Figure 1:
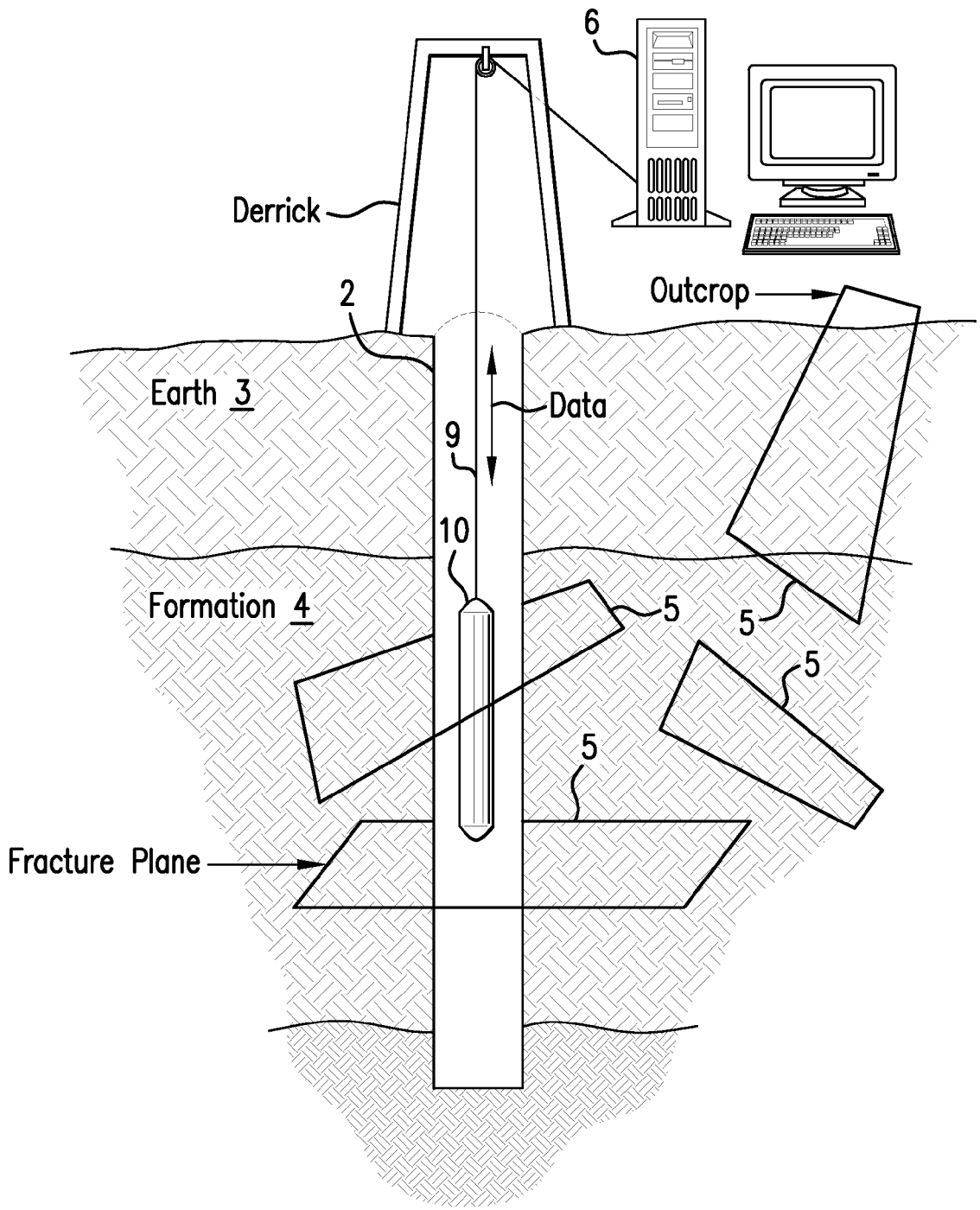
FIG. 1 illustrates an exemplary embodiment of a data acquisition tool disposed in a borehole penetrating the earth.

FIG. 1 illustrates an exemplary embodiment of a data acquisition tool 10 disposed in a borehole 2 penetrating the earth 3, which includes an earth formation 4. The earth formation 4 includes a reservoir of hydrocarbons or other fluids of interest disposed in rock pores. Also illustrated is a plurality of rock fractures 5 in the earth formation 4. The rock fractures 5 allow for hydraulic conductivity of formation fluids in the rock pores. The data acquisition tool 10 is configured to measure properties (e.g., porosity and permeability) of the formation 4 including characteristics of the fractures 5 (e.g., fracture orientation, fracture size, fracture intensity, fracture transmissivity, or fracture aperture). Non-limiting embodiments of measurements performed by the data acquisition tool 10 include seismic, acoustic, pulsed-neutron, resistivity, radiation, survey and imaging.

Still referring to FIG. 1, the downhole tool 10 is conveyed through the borehole 2 by a carrier 9. In the embodiment of FIG. 1, the carrier 9 is an armored wireline. Besides supporting the downhole tool 10 in the borehole 2, the wireline can also provide communications between the downhole tool 10 and a computer processing system 6 disposed at the surface of the earth 3. In logging-while-drilling (LWD) or measurement-while-drilling (MWD) embodiments, the carrier 9 can be a drill string. In while-drilling embodiments, measurement data can be transmitted to the computer processing system 6 using a telemetry system such as mud-pulse telemetry or wired drill pipe or stored in the downhole tool 10 for retrieval after the tool 10 is recovered from the borehole 2. Alternatively, the data acquisition tool may perform measurements at the surface of the earth or in a marine environment.

Figure 2:
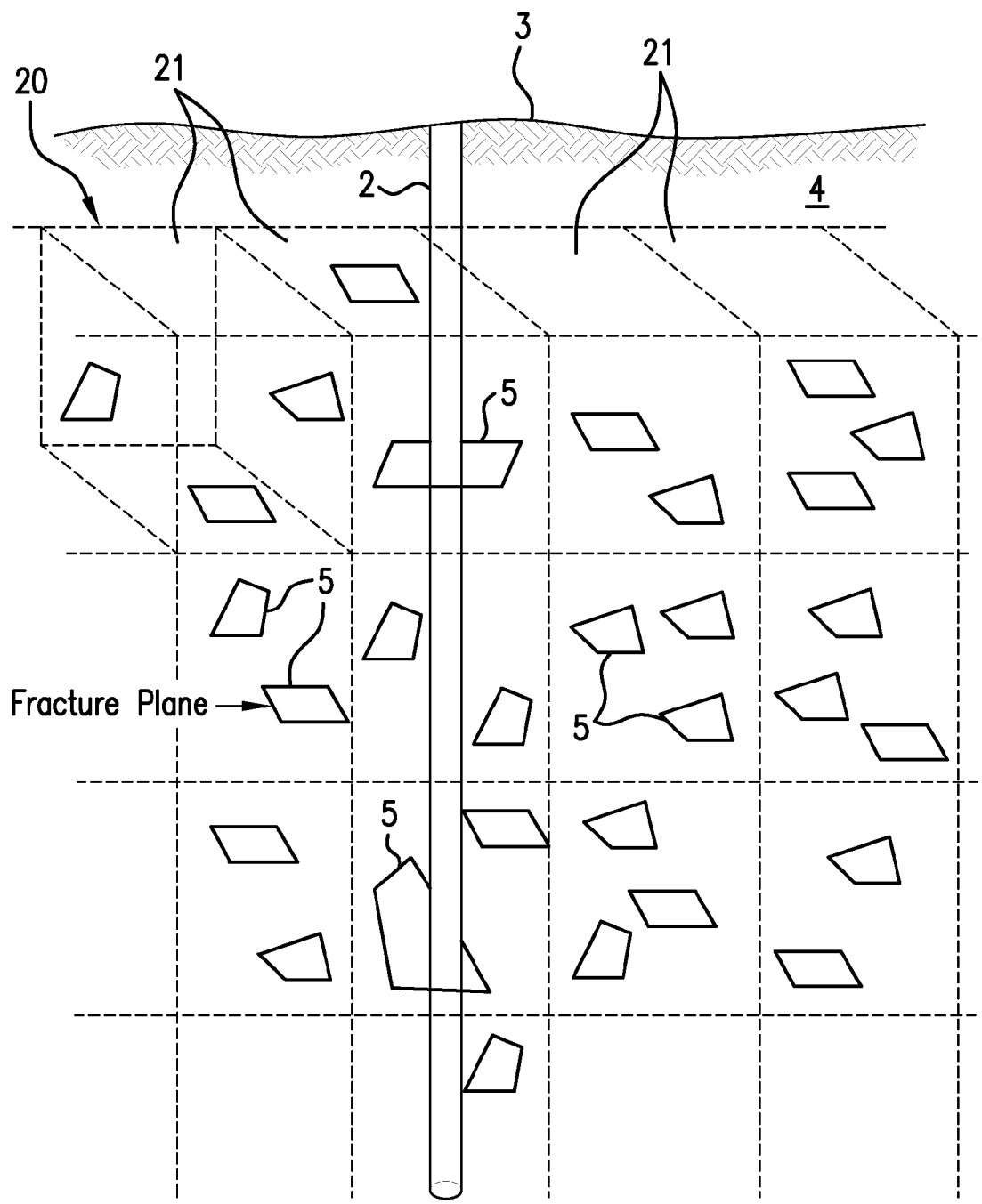
FIG. 2 illustrates an exemplary embodiment of a grid imposed on a representation of an earth formation having a plurality of fractures.

FIG. 2 illustrates an exemplary embodiment of a three-dimensional grid 20 superimposed on the earth formation 4. The grid 20 defines a plurality of grid cells 21. In each of the grid cells 21 are one or more of the fractures 5 although some cells 21 may not include any of the fractures 5. In one or more embodiments, one fracture 5 may cross boundaries of more than one grid cell 21 and, thus, affect the properties of all grid cells 21 that the fracture 5 intersects. Each of the grid cells 20 may have uniform dimensions or the dimensions can be non-uniform (i.e., non-regular). The three-dimensional grid 20 may also be referred to as a mesh recognizing that the mesh may have non-uniform spacing and be updated to a finer scale when needed to more accurately portray the fractures 5 in the earth formation 4 and/or associated calculated data. Updating of the mesh may be referred to as mesh refinement. It can be appreciated that the grid cells 21 can have various shapes and that the shapes can be non-uniform. In one or more non-limiting embodiments, the grid cells 21 are shaped as polygons.

Data acquired by the data acquisition tool 10 and by observations are organized to correspond to specific grid cells 21 that are related to the data. In addition, well bore images and observations may be used to create a Natural Fracture Model (NFM), which is a total network of all the fractures within a volume. In general, the NFM is created by distributing fractures within the volume according to rules defined by observations. A discrete fracture network is one example of a NFM. Wellbore images provide information about the orientations of fractures intersecting a well. Outcrop observations provide information about the fractures intersecting the surface of an outcrop. Each of these types of data is related to the actual fracture distribution, and so data from each can be used to generate an instance of a real fracture system that is consistent with those observations. Each of those instances is a NFM.

Surface seismic data provides information on the spatial distribution in the earth of the fractures, and that information is extracted from seismic data in a variety of ways. One way is by modeling the amount of deformation (i.e., curvature or bending) of a surface mapped seismically, and assuming that the shape of the surface controls the orientations and intensity of fractures intersecting that surface. Another way is by measuring an attribute (e.g. velocity) that is affected by fractures in a known way (e.g., velocity of waves perpendicular to fractures is lower than for waves parallel to fractures, in nearly all cases, because fractures are less stiff than the unfractured rock matrix).

The likelihood that an individual fracture is hydraulically conductive is much greater for fractures that are critically stressed than for fractures that are not critically stressed. The term "critically stressed" relates to a fracture that is in a condition of incipient shear failure. It is assumed that the likelihood of each fracture being hydraulically conductive is a function of the fracture's proximity to frictional failure. The fracture intensity at frictional failure (FIFF) of a grid cell 21 is the combined likelihood for all fractures in that grid cell 21 that each fracture is critically stressed. It is the frequency of fractures per grid cell 21 weighted by each of the fracture's proximity to frictional failure.

In one grid cell 21, the FIFF calculation is performed at the X, Y, Z location of the fracture center utilizing the fracture characteristics, three-dimensional (3D) stress orientation and magnitudes for the fracture, and pore pressure previously calculated for a 3D geomechanical model at the grid cell 21 containing the fracture center.

In general, when slip occurs at a fracture, the flow through fracture will increase. Slip will occur along a fracture plane if:

$$\tau - \mu\sigma_n - S_0 > 0 \tag{1}$$

where $\tau$ is the shear stress, which is what drives the slip, $S_0$ is the cohesion, $\mu$ is the coefficient of sliding friction, and $\sigma_n$ is the stress normal to the fracture plane. Together, $\mu\sigma_n$ and $S_0$ provide the "strength" of the fracture to resist slip. When this relationship is equal to zero, the fracture is in equilibrium, i.e., the shear stress is equal to what is required to cause slip. The effective normal stress is the total stress, $S_n$, minus the pore pressure $P_p$, times Biot's poroelastic constant, $\alpha$, or expressed mathematically as:

$$\sigma_n = S_n - \alpha P_p. \tag{2}$$

In one embodiment, the FIFF is the critical $\mu$ or the critical value of the coefficient of sliding friction for slip. The FIFF maybe expressed for each fracture $j=1, 2, \ldots m$ as:

$$\text{FIFF}(j) (\text{i.e., critical } \mu_{(j)}) = [\tau_{(j)} - S_{0(j)}]/\sigma_{n(j)} \tag{3}$$

where $\tau$ represents the shear stress at the fracture j, $S_0$ represents cohesion at the fracture j, and $\sigma_n$ represent stress normal to the fracture plane at the fracture j. The shear stress, $\tau$, and the normal stress, $\sigma_n$, are derived from principal stress magnitudes $S_1$, $S_2$, $S_3$ using the direction cosines between the stress tensor and the fracture plane as described in the following two equations:

$$\tau = \beta_{11}\beta_{21}S_1 + \beta_{12}\beta_{22}S_2 + \beta_{13}\beta_{23}S_3 \tag{4}$$

$$\sigma_n = \beta_{11}^2 S_1 + \beta_{12}^2 S_2 + \beta_{13}^2 S_3 \tag{5}$$

where $S_{1,2,3}$ are principal stress magnitudes for the three components of a stress tensor and $\beta_{11}$, $\beta_{12}$, $\beta_{13}$, $\beta_{21}$, $\beta_{22}$, and $\beta_{23}$ are direction cosines between the stress tensor and the fracture plane. In one embodiment, $S_1$ is the most compressive stress and $S_3$ is the most tensile stress. In one embodiment, $S_1$, $S_2$, and $S_3$ may be considered normal stresses acting in a coordinate system in which the 1, 2, and 3 coordinate axes are oriented in such as way that there is no shear stress on planes that are perpendicular to each of those coordinate axes. The term $\sigma_n$ is the normal traction (equivalently the normal stress) acting perpendicular to a fracture that may be inclined to the principal stress axes. The $\beta$'s are direction cosines, which are the elements of a 3×3 rotation tensor, which transforms a vector in one coordinate system into the units of another coordinate system. The subscripts correspond to a row or column number of the rotation tensor. Each subscript of a $\beta$ relates to one of two coordinate systems—one coordinate system for the fracture orientation and one coordinate system for the principal stress orientation. For example, $\beta_{xy}$ is the cosine of the angle between the xth direction in one of those coordinate systems and the yth direction in the other of those coordinate systems.

Data is obtained for each fracture j from the corresponding grid cell 21 to calculate the direction cosines, $\beta$, the shear stress, $\tau$, and the effective normal stress $\sigma_n$. Using these calculated values, the FIFF is calculated for each fracture j.

In order to calculate a fracture intensity at friction failure for each grid cell, the FIFFs are summed for all fractures within each of the grid cells. The sum of the FIFFs for each of the grid cells 21 in a structural model may be described mathematically as:

$$\sum_{j=1}^{m} FIFF(j)$$

in order to provide a volume populated with the intensity of stress sensitive fractures j to establish ambient reservoir conditions. Fracture intensity in this context relates to the number of fractures per three-dimensional (3D) grid cell.

Figure 3:
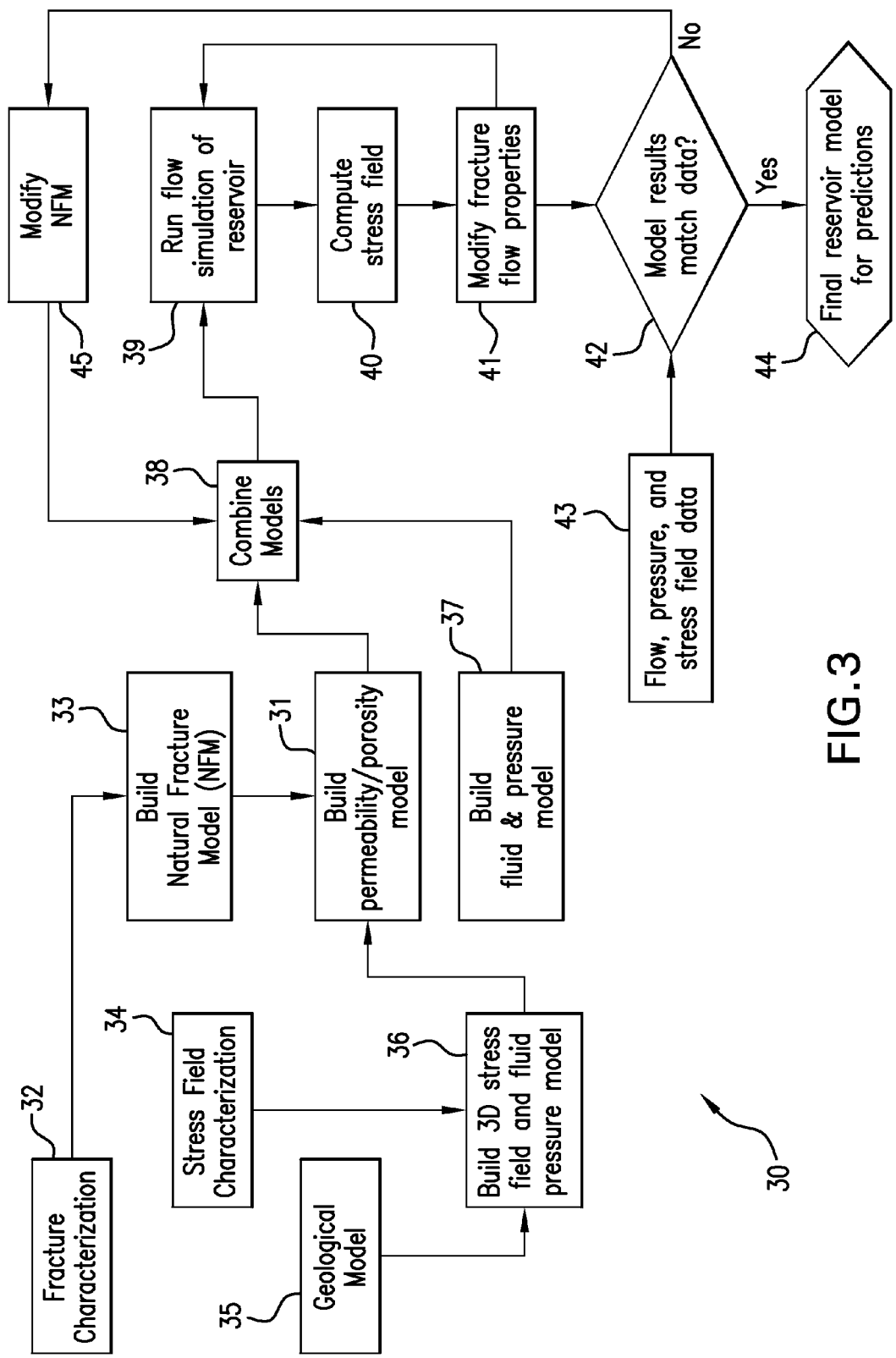
FIG. 3 illustrates one example of a workflow for modeling flow properties of a reservoir in the earth formation.

Reference may now be had to FIG. 3 illustrating one example of a workflow diagram 30 for implementing the reservoir modeling techniques disclosed herein. In the workflow diagram 30, two reservoir models are created and then combined. One of the models is a permeability/porosity model 31. Data for building the model 31 is input in two ways. In a first way, fracture characterization data 32 is used to build a Natural Fracture Model (NFM) 33, which is then input into the model 31. In a second way, stress field characterization data 34 and a geological model 35 are used to build a 3D stress field and fluid pressure model 36 of the reservoir. The 3D stress and fluid pressure model 36 is then input into the model 31. The other of the two models is a fluid and pressure model 37. In general, the NFM 33 is built using the geological model 35 and geological observations of stress induced features detected using the data acquisition tool 10. Non-limiting examples of the stress induced features include hydraulic fractures, earthquake fractures, sheared casing fractures, borehole breakouts, and tensile fractures.

Both the model 31 and the model 37 are combined in step 38 and input to a flow simulation 39, which, in one or more embodiments, computes how fluids move and fluid pressure changes through the reservoir. From the flow simulation 39, three-dimensional stress fields 40 or changes from the 3D stress model 36 are computed. The stress fields 40 or the stress changes are then used to modify fracture flow properties 41. The modified fracture flow properties 41 are then compared 42 with flow, pressure, and stress field data 43 and also input to the flow simulation 39 as an iterative step. It can be appreciated that steps 39, 40 and 41 may be carried out repeatedly over a period for which a flow computation is carried out until a reservoir simulation run is complete. If the reservoir model with the modified fracture flow properties 41 (at the end of the reservoir simulation run) provides results that match the data 43, then the model is considered final for making reservoir predictions 44. If the reservoir model with the modified fracture flow properties 41 does not provide results that match the data 43, then the NFM is modified in step 45 and input to the combined model in step 38. In general, the workflow depicted in the workflow diagram 30 is implemented by a computer processing system such as the computer processing system 6.

Figure 4:
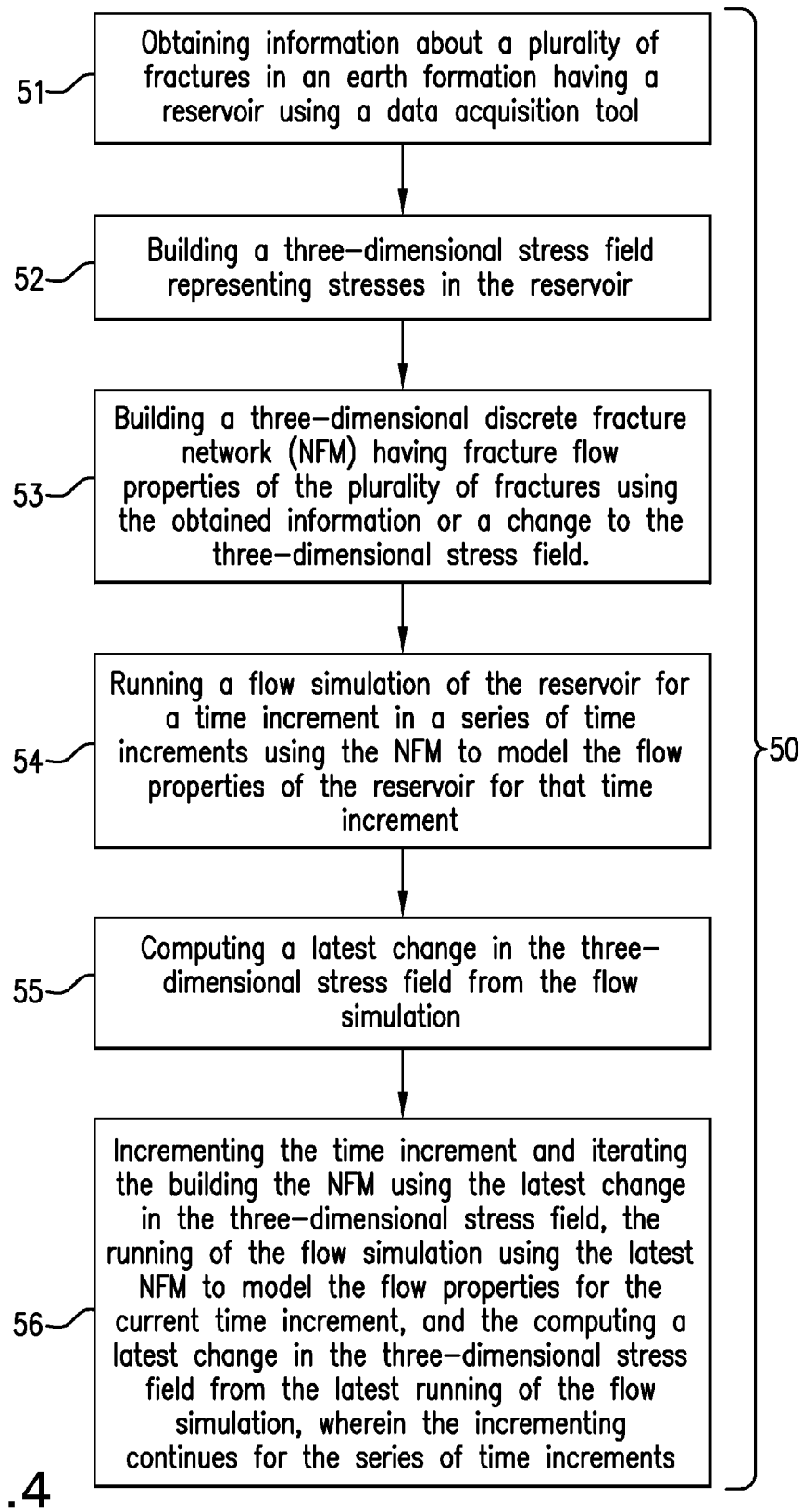
FIG. 4 illustrates one example of a method for modeling flow properties over a series of time increments of a reservoir in an earth formation having a plurality of fractures.

FIG. 4 illustrates one example of a method 50 for modeling flow properties over a series of time increments of a reservoir in an earth formation having a plurality of fractures. In general, the time increments are continuous over a time period during which the flow properties of the reservoir are modeled. In one or more embodiments, the time increments can approach zero for use in calculus calculations. The method 50 calls for (step 51) obtaining information about the plurality of fractures using a data acquisition tool. The tool can be conveyed in a borehole penetrating the earth formation or disposed at a surface of the earth. Further, the method 50 calls for (step 52) building a three-dimensional stress field representing stresses in the reservoir. Initially, the stress field can be built using a geological model and then further refined or updated using results from flow simulations. Further, the method 50 calls for (step 53) building a three-dimensional natural fracture model (NFM) having fracture flow properties of the plurality of fractures using the obtained information or a change to the three-dimensional stress field. The fracture flow properties can include the FIFF calculated for each fracture. Computed changes to the stress field can affect the fracture flow properties and the FIFFs and, thus, can affect the NFM. Further, the method 50 calls for (step 54) running a flow simulation of the reservoir for a time increment using the NFM to model the flow properties of the reservoir for that time increment. Further, the method 50 calls for (step 55) computing a latest change in the three-dimensional stress field from the flow simulation. Further, the method 50 calls for (step 56) incrementing the time increment and iterating the building the NFM using the latest change in the three-dimensional stress field, the running of the flow simulation using the latest NFM to model the flow properties for the current time increment, and the computing a latest change in the three-dimensional stress field from the latest running of the flow simulation, wherein the incrementing continues for the series of time increments. The incrementing relates to incrementing the time increment to the next time increment in the series of time increments where the series is continuous for a length of time. In general, the rebuilding of the NFM using the latest change in the three-dimensional stress field includes recalculating the FIFF for each fracture using the latest change in the three-dimensional stress field. The method 50 can also include for one or more time increments, comparing the modeled flow properties to data from the obtained information and, if the modeled flow properties are not within a selected range of the data, then iteratively modifying the NFM, running the flow simulation, computing a latest change in the three-dimensional stress field, and modifying the fracture flow properties until the modeled flow properties are within the selected range of the data.

It can be appreciated that the reservoir modeling techniques disclosed herein can be used to model or simulate flow streams within a reservoir.

It can be appreciated that the workflow described in the workflow diagram 30 does not convert a NFM to an equivalent porous medium, but keeps track of each fracture in the NFM, providing for increased accuracy over prior art reservoir models. The modification of fracture flow properties 41 in the workflow diagram 30 can relate to re-computation of the FIFF to take into account changes in fracture properties due to changes in the flow, pressure and stress fields.

It can be appreciated that the techniques disclosed herein for modeling fractured media in a reservoir allow for changes to individual fractures to be tracked throughout the simulation and, thereby, provide a more realistic and accurate prediction of how reservoir flow properties change throughout the life of a reservoir. Improvements over the prior art include modeling: growth of fractures, multiphase flow, winnowing by proximity to slip, and connections between fractures. The disclosed modeling techniques can be used to: (1) model production and injection of a reservoir, (2) develop improved decline curves, (3) design field developments to minimize and mitigate hazards such as water breakthrough, (4) determine locations of "sweet spots" (e.g., high concentrations of producible hydrocarbons) in the reservoirs, (5) guide decisions on orientation and length of wells, and (6) predict response to stimulation to improve determination of reservoir properties from well tests.

It can be appreciated that one or more steps or modules of the work flow diagram 30 or the method 50 can be implemented using commercially available software. However, none of the commercially available software alone or in combination teaches all of teachings disclosed herein.

The method flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

In support of the teachings herein, various analysis components may be used, including a digital and/or an analog system. For example, data acquisition tool 10 or the computer processing system 6 may include the digital and/or analog system. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, a power supply (e.g., at least one of a generator, a remote supply and a battery), magnet, electromagnet, sensor, electrode, transmitter, receiver, transceiver, antenna, controller, optical unit, electrical unit or electromechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for modeling flow properties over a series of time increments of a reservoir in an earth formation comprising a plurality of fractures, the method comprising:
    obtaining information about the plurality of fractures using a data acquisition tool;
    building a three-dimensional stress field representing stresses in the reservoir;
    building a three-dimensional natural fracture model (NFM) comprising fracture flow properties of the plurality of fractures using the obtained information or a change to the three-dimensional stress field;
    running a flow simulation of the reservoir for a time increment using the NFM to model the flow properties of the reservoir for that time increment;
    computing a latest change in the three-dimensional stress field from the flow simulation; and
    incrementing the time increment and iterating the building the NFM using the latest change in the three-dimensional stress field, the running of the flow simulation using the latest NFM to model the flow properties, and the computing a latest change in the three-dimensional stress field from the latest running of the flow simulation, wherein the incrementing continues for the series of time increments;
    wherein building a three-dimensional NFM comprises establishing a three-dimensional mesh comprising a plurality of cells to represent the reservoir and the method further comprises calculating a fracture intensity at frictional failure for each fracture in each cell using the obtained information and the latest change in the three-dimensional stress field wherein the fracture flow properties in the NFM comprise the fracture intensity at frictional failure for each fracture.

2. The method according to claim 1, further comprising, for one or more time increments, comparing the modeled flow properties to data from the obtained information and, if the modeled flow properties are not within a selected range of the data, then iteratively modifying the NFM, running the flow simulation, computing a latest change in the three-dimensional stress field, and modifying the fracture flow properties until the modeled flow properties are within the selected range of the data.

3. The method according to claim 2, wherein the data comprises flow, pressure, or stress data.

4. The method according to claim 1, wherein the mesh comprises non-regular spacings or shapes of the cells.

5. The method according to claim 1, wherein at least one cell in the plurality of cells has a polygon shape.

6. The method according to claim 1, wherein the fracture intensity at frictional failure (FIFF) for each fracture j is defined as:

$$FIFF(j)=[\tau_{(j)}-S_{0(j)}]/\sigma_{n(j)}$$

where $\tau_{(j)}$ is the shear stress at fracture j; $S_{0(j)}$ is cohesion at fracture j; and $\sigma_n$ is the stress normal to the fracture plane at fracture j.

7. The method according to claim 6, further comprising recalculating the FIFF using the latest change in the three-dimensional stress field each time the latest change in the three-dimensional stress field is computed.

8. The method according to claim 1, further comprising refining one or more characteristics of the mesh to improve accuracy of the modeling of flow properties.

9. The method according to claim 8, wherein the refining occurs when changes in calculated fracture flow properties occur over a mesh spatial span that is decreased from the mesh spatial span where the calculated fracture flow properties were previously calculated, and wherein the changes exceed a selected criterion.

10. An apparatus for modeling flow properties over a series of time increments of a reservoir in an earth formation comprising a plurality of fractures, the apparatus comprising:
a processor configured to implement a method comprising:
building a three-dimensional stress field representing stresses in the reservoir;
building a three-dimensional natural fracture model (NFM) comprising fracture flow properties of the plurality of fractures using information obtained from the tool or a change to the three-dimensional stress field, and establishing a three-dimensional mesh comprising a plurality of cells to represent the reservoir;
running a flow simulation of the reservoir for a time increment using the NFM to model the flow properties of the reservoir for that time increment;
computing a latest change in the three-dimensional stress field from the flow simulation; and
incrementing the time increment and iterating the building the NFM using the latest change in the three-dimensional stress field, the running of the flow simulation using the latest NFM to model the flow properties, and the computing a latest change in the three-dimensional stress field from the latest running of the flow simulation, wherein the incrementing continues for the series of time increments;
wherein the fracture flow properties in the NFM comprise a fracture intensity at frictional failure (FIFF) for each fracture in the plurality of fractures and the processor is further configured to calculate a fracture intensity at frictional failure for each fracture in each cell using the obtained information and to update the FIFFs using the latest change in the three-dimensional stress field each time the latest change in the three-dimensional stress field is computed.

11. The apparatus according to claim 10, wherein the processor is further configured to implement a method comprising: for one or more time increments, comparing the modeled flow properties to data from the obtained information and, if the modeled flow properties are not within a selected range of the data, then iteratively modifying the NFM, running the flow simulation, computing a latest change in the three-dimensional stress field, and modifying the fracture flow properties until the modeled flow properties are within the selected range of the data.

12. The apparatus according to claim 10, wherein the data acquisition tool is configured to perform seismic, acoustic, pulsed-neutron, resistivity, radiation, survey, or imaging measurements.

13. The apparatus according to claim 10, wherein the data acquisition tool is configured to be conveyed through a borehole by a carrier.

14. The apparatus according to claim 13, wherein the carrier comprises a wireline, a slickline, a drill string or coiled tubing.

15. The apparatus according to claim 10, wherein the data acquisition tool is configured to perform measurements at a surface of the earth.

16. A non-transitory computer readable medium comprising computer executable instructions for modeling flow properties over a series of time increments of a reservoir in an earth formation comprising a plurality of fractures by implementing a method comprising:
obtaining information about the plurality of fractures using a data acquisition tool;
building a three-dimensional stress field representing stresses in the reservoir;
building a three-dimensional natural fracture model (NFM) comprising fracture flow properties of the plurality of fractures using the obtained information or changes to the three-dimensional stress field;
running a flow simulation of the reservoir for a time increment using the NFM to model the flow properties of the reservoir for that time increment;
computing a latest change in the three-dimensional stress field from the flow simulation; and
incrementing the time increment and iterating the building the NFM using the latest change in the three-dimensional stress field, the running of the flow simulation using the latest NFM to model the flow properties, and the computing a latest change in the three-dimensional stress field from the latest running of the flow simulation, wherein the incrementing continues for the series of time increments;
wherein building a three-dimensional NFM comprises establishing a three-dimensional mesh comprising a plurality of cells to represent the reservoir and the method further comprises calculating a fracture intensity at frictional failure for each fracture in each cell using the obtained information and the latest change in the three-dimensional stress field wherein the fracture flow properties in the NFM comprise the fracture intensity at frictional failure for each fracture.

17. The non-transitory computer readable medium according to claim 16, wherein the method further comprises, for one or more time increments, comparing the modeled flow properties to data from the obtained information and, if the modeled flow properties are not within a selected range of the data, then iteratively modifying the NFM, running the flow simulation, computing a latest change in the three-dimensional stress field, and modifying the fracture flow properties until the modeled flow properties are within the selected range of the data.

* * * * *